(12) United States Patent
Yoo

(10) Patent No.: US 6,737,361 B2
(45) Date of Patent: May 18, 2004

(54) METHOD FOR $H_2$ RECYCLING IN SEMICONDUCTOR PROCESSING SYSTEM

(75) Inventor: Woo Sik Yoo, Palo Alto, CA (US)

(73) Assignee: WaferMaster, Inc, San Jose, CA (US)

( * ) Notice: Subject to any disclaimer, the term of this patent is extended or adjusted under 35 U.S.C. 154(b) by 119 days.

(21) Appl. No.: 09/828,518

(22) Filed: Apr. 6, 2001

(65) Prior Publication Data

US 2002/0146506 A1 Oct. 10, 2002

(51) Int. Cl.$^7$ .............................................. H01L 21/31
(52) U.S. Cl. ......................................................... 438/758
(58) Field of Search ................................ 438/758, 759, 438/760; 118/725; 136/255; 427/255, 578

(56) References Cited

U.S. PATENT DOCUMENTS

| | | | |
|---|---|---|---|
| 4,388,342 A | * 6/1983 | Suzuki et al. ................... | 117/86 |
| 4,460,673 A | 7/1984 | Sukigara et al. ............ | 430/128 |
| 4,476,094 A | 10/1984 | Carson ......................... | 422/62 |
| 4,732,110 A | * 3/1988 | Parsons ....................... | 118/719 |
| 5,284,519 A | * 2/1994 | Gadgil ......................... | 118/715 |
| 5,607,511 A | * 3/1997 | Meyerson .................... | 118/715 |
| 5,660,682 A | 8/1997 | Zhao et al. .................. | 438/715 |
| 5,665,640 A | 9/1997 | Foster et al. ................ | 438/680 |
| 5,882,424 A | 3/1999 | Taylor et al. ................ | 134/1.1 |
| 5,956,616 A | 9/1999 | Mizuno et al. .............. | 438/680 |
| 6,124,545 A | * 9/2000 | Bauer et al. ................. | 136/255 |
| 6,410,090 B1 | * 6/2002 | Wang ..................... | 427/255.18 |

FOREIGN PATENT DOCUMENTS

| | | |
|---|---|---|
| EP | 0334664 A | 9/1989 |
| EP | 0771887 A | 5/1997 |
| JP | 58223612 A | 12/1983 |
| JP | 63045199 A | 2/1988 |

OTHER PUBLICATIONS

"Epitaxy," C. W. Pearce; *VLSI Technology*; 2$^{nd}$ Edition; S. M. Sze, Editor, AT&T Bell Laboratories, Murray Hill, New Jersey; McGraw–Hill, Inc.; Chapter 2, Sections 2.1–2.2.3; pp. 55–69.

* cited by examiner

*Primary Examiner*—John F. Niebling
*Assistant Examiner*—Olivia T. Luk
(74) *Attorney, Agent, or Firm*—MacPherson Kwok Chen & Heid LLP

(57) ABSTRACT

A system and method for conserving and/or recycling hydrogen used in processing operations. The present invention can be used with any conventional reactor, which supports semiconductor processes using hydrogen. Hydrogen is pumped into the reactor from a hydrogen gas supply chamber. The hydrogen is used in the reactor as needed to perform the process function. The hydrogen accompanied with other process gases is exhausted from the reactor. The exhausted gases are routed through a scrubber, which is used to separate the hydrogen from the other gases. The other gases are allowed to vent from the system in a typical manner. The hydrogen is then pumped through an $H_2$ purifier, which cleans the hydrogen gas making the gas once again useable in the semiconductor process.

14 Claims, 2 Drawing Sheets

METHOD FOR H₂ RECYCLING IN SEMICONDUCTOR PROCESSING SYSTEM

BACKGROUND OF THE INVENTION

1. Field of the Invention

The invention is generally related to semiconductor processing, and more particularly to methods of hydrogen conservation and recycling in semiconductor processing operations.

2. Related Art

There are numerous semiconductor reactors, which are designed to perform various semiconductor processes on semiconductor substrates. Typically, during many of these processes hydrogen gas is employed for various purposes. For example, a method is disclosed in U.S. Pat. No. 5,660,682, for removing undesired material from an integrated circuit. In this method, a flow of argon and hydrogen are energized in a reactor to form a plasma, which reacts with the material to be removed, to form a gaseous product. The gaseous product is then subsequently removed from the reactor. In another example, a method is disclosed in U.S. Pat. No. 5,882,424, for depositing a thin film of Ti or TiN on a substrate by plasma enhanced CVD, which uses $H_2$ as a preferred process gas.

Although, these exemplary uses of hydrogen in semiconductor processes are by no means exhaustive, they do suggest the potential advantage of hydrogen use to the semiconductor processing art. Unfortunately, hydrogen tends to be wasted in large amounts from most processing systems. Moreover, the excess hydrogen poses a potential fire and explosion hazard. For this reason, the excess hydrogen is typically burned away in a relatively costly process. Moreover, since hydrogen is itself a relatively expensive gas, processing costs for process including hydrogen may be substantial. Hydrogen is also difficult to store in large amounts in vapor phase do to volume requirements. Thus, hydrogen is typically stored in liquid phase, and converted to vapor phase, requiring large amounts of energy.

For these reasons, what is needed is a system and method for conserving and/or recycling hydrogen used in semiconductor processing operations, which may reduce hazards, costs, and energy consumption.

SUMMARY

The present invention provides a system and method for conserving and/or recycling hydrogen used in semiconductor processing operations. The present invention can be used with any conventional reactor, which supports semiconductor processes using hydrogen. Alternatively, the present invention can be used with a modified reactor, described in detail below.

In the present invention, hydrogen is pumped into the reactor from a hydrogen gas supply chamber. The hydrogen is used in the reactor as needed to perform the process function. The hydrogen accompanied with other process gases is exhausted from the reactor. The exhausted gases are routed through a scrubber, which is used to separate the hydrogen from the other gases. The other gases are allowed to vent from the system in a typical manner. The hydrogen is then pumped through an $H_2$ purifier, which cleans the hydrogen gas making the gas once again useable in the semiconductor process.

In one aspect of the present invention, a process is provided for recycling a vapor-phase chemical. The method includes introducing vapor-phase chemicals into a reactor with sufficiently supplied energy to cause a reaction in said reactor; exhausting gases resulting from the reaction; separating a first gas from the exhausted gases; purifying the first gas; and thereafter introducing the first gas into the reactor.

In another aspect of the invention, a system is provided for recycling a vapor phase chemical. The system includes a reactor chamber capable of receiving and exhausting the vapor-phase chemicals. A gas scrubber is also provided, which is capable of receiving the vapor-phase chemicals exhausted from the reactor chamber. The scrubber outputs a first gas; which is directed to a gas purifier capable of purifying the first gas. Once the first gas is purified it is returnable to the reactor chamber.

Advantageously, the present invention may return between approximately 80% to 90% of the initial hydrogen let into the reactor. Accordingly, if for example, 90% of the hydrogen is returned to the reactor, only 10% of the initial amount needs to be added for subsequent processes. The conservation and recycling of hydrogen used in semiconductor processing operations helps to reduce processing costs. For example, since the hydrogen requirement is reduced, the need to convert large amounts of liquid hydrogen to gaseous hydrogen is removed, which lowers overall energy consumption.

These and other features and advantages of the present invention will be more readily apparent from the detailed description of the embodiments set forth below taken in conjunction with the accompanying drawings.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

Embodiments of the present invention will be described with reference to the aforementioned figures. These figures have been simplified for ease of understanding and describing the embodiments.

DETAILED DESCRIPTION

The present invention does not specifically concern the process employed to carry out processing operations on a semiconductor substrate or wafer, but rather concerns a system and process for conserving and/or recycling hydrogen, which may be used in the processing operations.

Figure 1:
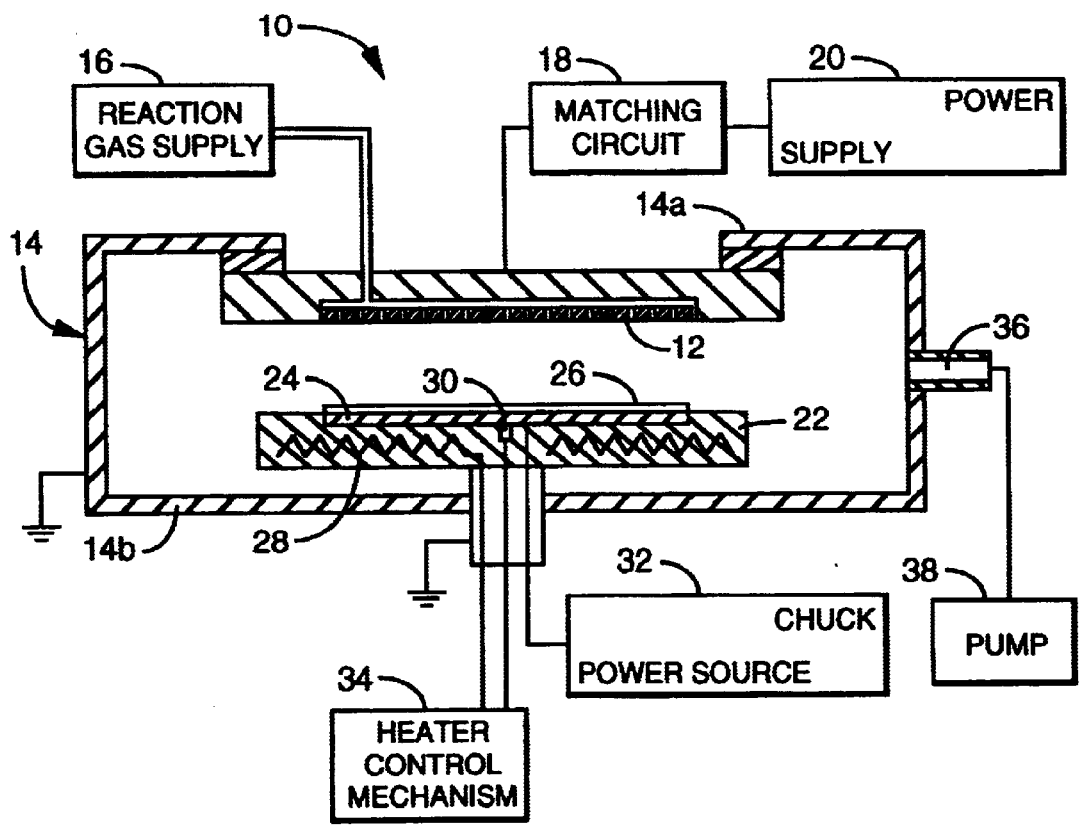
FIG. 1 is a simplified illustration of a conventional reactor suitable for use with the present invention.

For ease of understanding and clarity, FIG. 1 is a simplified illustration of a typical processing operation. Apparatus 10 includes a gas delivery showerhead 12 provided in upper wall 14a of reactor 14, which is used for introducing reaction gas, supplied from reaction gas supply mechanism 16, into the reactor 14. Showerhead 12 is formed from an electrically conductive material. A voltage of fixed frequency is applied to showerhead 12 through matching circuit 18 from power supply 20.

A substrate holder 22 is provided along bottom wall 14b of reactor 14. A plate 24 for fixing a substrate 26 is provided on the substrate mounting surface of substrate holder 22, facing showerhead 12. A heater 28 and a thermocouple 30 are provided within substrate holder 22. The required voltage is supplied from power source 32 to plate 24. Temperature data obtained by measurement with thermocouple 30 is input to heating control mechanism 34. Heating control mechanism 34 maintains substrate holder 22 at a desired temperature by applying the required electrical power to heater 28 on the basis of the measured temperature data.

Typically, a vent 36 connected to an external pump 38 is provided. Hydrogen alone or in combination with other process gases, such as $NH_3$, $N_2O$, $SiF_4$, $TiCl_4$, $N_2$, Ar, $SiH_4$, HCl, and $SiCl_4$ are introduced from showerhead 12. The gases are excited in the space between showerhead 12 and substrate holder 22, by applying electrical power to showerhead 12 by means of power supply 20, thereby depositing the desired thin film on substrate 24. The unreacted gas and the product gas in reactor 14 are pumped out of the system through vent 36 by means of pump 38.

Figure 2:
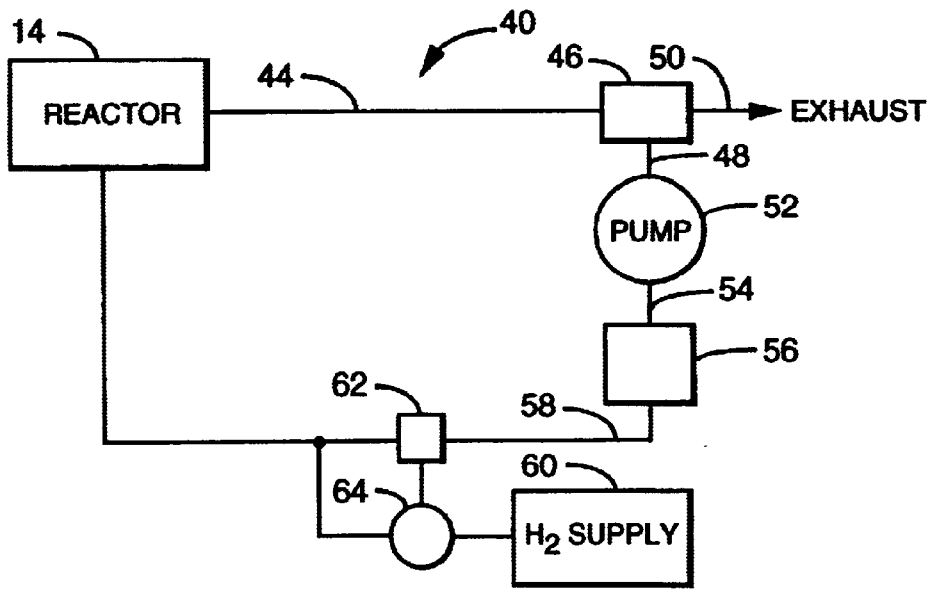
FIG. 2 is a schematic illustration of an embodiment of the present invention.

FIG. 2 is a schematic illustration of an embodiment of hydrogen conservation/recycling system 40 in accordance with the present invention. System 40 includes any apparatus 10, which can support a semiconductor process, which includes the use of hydrogen. For example, with no intent to limit the invention thereby, the processes disclosed in U.S. Pat. No. 5,660,682, and U.S. Pat. No. 5,956,616, both of which are herein incorporated by reference for all purposes.

In one embodiment, reactor 14 of system 40 is operatively coupled to a scrubber 46, which is used to separate gases vented from reactor 14 via line 44. In this embodiment, scrubber 46 is used to separate hydrogen from the remaining unreacted or product gases. Once separated or scrubbed of impurities, the hydrogen is returned to the system via line 48, while the other gases and impurities are exhausted from the system via line 50. In one embodiment, scrubber 46 may be a dry scrubber. In operation scrubber 46 receives $H_2$, product gases and impurities from reactor 14. Scrubber 46 includes a filtering mechanism that is permeable only to $H_2$. An exemplary scrubber 46 is available from Matheson Tri-Gas® of Parsippany, N.J.

A pump 52 can be added to system 40 to ensure that the separated hydrogen is able to adequately flow through system 40. In this embodiment, pump 52 can provide approximately 50 psig to 250 psig. An example of a suitable pump 52 is available from KASHIYAMA IND., LTD.

The separated hydrogen enters an $H_2$ purifier 56 via line 54. Purifier 56 "cleans" the separated hydrogen, making the separated hydrogen suitable for reuse in reactor 14. Hydrogen purifier 56 cleans the separated hydrogen, using any well known technique, for example, using a heated paradium membrane/filter. In one embodiment, as an example with no intent to limit the invention, the effluent from purifier 56 can have a capacity of about 24 SLPM, 50 SCFH.115 V standard, 50/60 Hz and a total impurity level of less than about 0.5 ppm. The operating pressure of purifier 56 can range from between 50 psig and 200 psig. An $H_2$ purifier 56 of this type is available from Matheson TriGas®, for example, Model 8374V. Once purified, the $H_2$ gas can be returned to reactor 14 via line 58.

Initially, $H_2$ is added to system 40 from $H_2$ gas supply 60. A sensor 62, may be placed into line 58 to determine the quantity of purified $H_2$ being re-introduced into reactor 14. Typically, some processes can require up to approximately about 200 l/min to about 500 l/min of $H_2$ per operation.

Thus, if sensor 62 determines that the delivery rate of $H_2$ to reactor 14 has dropped below required levels, mass flow meter 64 can be activated allowing additional $H_2$ to be added to system 40 to maintain the required levels. In a typical operation of system 40, 80% to 90% of the initial $H_2$ can be recovered for reuse in reactor 14.

Figure 3:
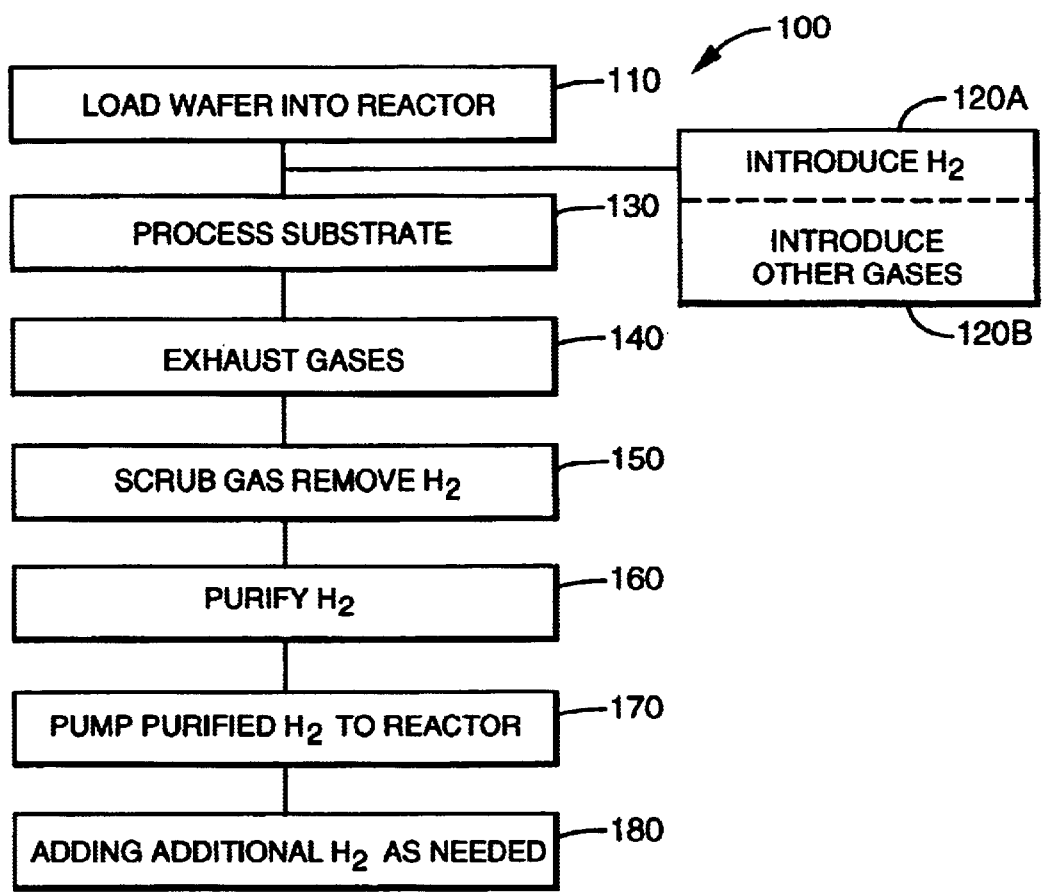
FIG. 3 illustrates a flow chart of one embodiment of the process of the present invention.

FIG. 3 illustrates a flow chart of one embodiment of process 100 of the present invention, which will be described with reference to components identified and described with reference to both FIGS. 1 and 2. As an initial step 110, substrate 26 is positioned on substrate holder 22 in reactor 14. Substrate 26 can be heated to a temperature above 200° C.; preferably, to a temperature generally in the range of between about 200° C. to about 500° C., for example 400° C. In this manner, substrate 26 is prepared for receiving a film to be deposited on the upper surface of the substrate. Substrate 26 may be a bare silicon wafer. In alternative embodiments, substrate 26 may be a silicon wafer having a metal barrier and/or etch stop layer of SiNx, Ta(N), TiN, WNx, or the like, thereon.

Next, process 100 includes the introduction of a flow of $H_2$ (action 120a) and reactant gases (action 120b) into reactor 14 as required for a particular process. In one embodiment, in addition to the $H_2$, the gases can include, but are not limited to, $NH_3$, $N_2O$, $SiF_4$, $SiH_4$, $TiCl_4$, $N_2$, Ar, HCl, and $SiCl_4$ introduced via showerhead 12. The ratios of particular gases to deposit a particular thin film on substrate 26 are determined and selected in accordance with the specific process being conducted in reactor 14. Alternatively, $H_2$ can be introduced into reactor 14 to perform a plasma cleaning operation of the substrate.

In a typical CVD process, as the gases enter reactor 14, suitable power is applied to begin the processing of the substrate (action 130). As is known to those skilled in the art of CVD processing, the power supplied in reactor 14 excites the introduced gases, generating radicals which are deposited on the surface of substrate 36.

Once processing of substrate 26 is complete, the unreacted gases and the product gases (hereinafter the "gases") are exhausted from reactor 14 (action 140) through vent 36 using pump system 38.

With reference now to the embodiment of FIG. 2, the vented gases are directed to a scrubber 46. The scrubber separates $H_2$ from the remainder of the gases (action 150). The remaining gas is then exhausted from the recycling system. The separated $H_2$, however, is pumped using pump 52 through $H_2$ purifier 56. The $H_2$ is then purified (action 160) and returned to reactor 14 for re-use (action 170). As necessary, additional $H_2$ can be added to system 40 to ensure that a predetermined flow rate of $H_2$ is maintained (action 180). In one embodiment, the additional $H_2$ may be approximately 10% to 20% of the $H_2$ introduced at the beginning of the process (action 120a).

Figure 4:
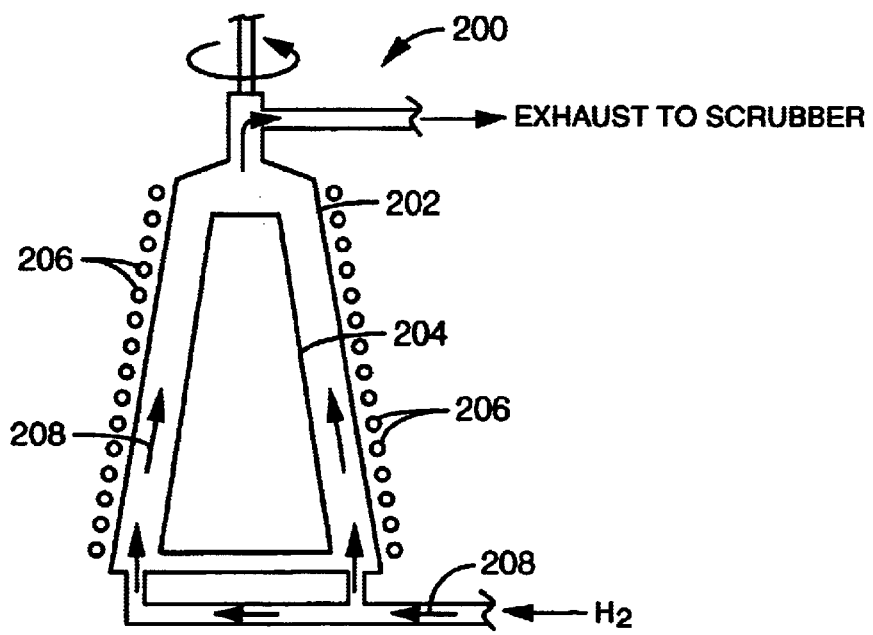
FIG. 4 is a simplified illustration of an embodiment of a reactor for use with the present invention.

FIG. 4 is a simplified illustration of an embodiment of a reactor 200 for use in accordance with the present invention. Reactor 200 includes a tapered shell 202, being wider at a bottom portion than at a top portion. The taper of shell 202 can have a diameter at the widest portion from between about 6 inches to about 100 inches; preferably between about 10 inches to about 80 inches.

Reactor 200 also includes a substrate holder or susceptor 204, which has a tapered shape, which corresponds with the taper of shell 202. In one embodiment, the clearance between shell 202 and susceptor 204 is between no less than between about 1 mm and 200 mm; for example about 25 mm. Susceptor 204 provides mechanical support for the substrates and are the source of thermal energy for the reaction. Susceptor 204 is non-contaminating to the process and does not react with the process reactants. Preferably, susceptor 204 is made of graphite, which can be coated with approximately 50 to 500 µm of SiC or similar material to make up for the impurity and softness of the graphite. The susceptor is also coated to couple susceptor 204 to the RF field. Substrates are carried on susceptor 204 by a carbon blank shaped to the dimensions of the substrate.

An induction coil 206 surrounds shell 202 to provide energy for the reaction. The energy is transferred to the substrate via conduction and radiation. In one embodiment, induction coils 206 are formed along the tapered surface of shell 202. Accordingly, since the distance from the coils to the susceptor surface is evenly maintained, the spacing of induction coils need not be uniform to provide the same uniform heating. Thus, relatively fewer coils may be used in reactor 200.

In one embodiment, hydrogen gas is introduced into shell 202 as indicated in FIG. 4 from below susceptor 204. In this manner, the $H_2$ gas flows through reactor 200 in the direction indicated by arrows 206. Hydrogen is carried through shell 200 without the need for forcing the gas through the system. Moreover, the tapered shape of shell 202 and susceptor 204 maintains an even reactant concentration throughout reactor 200. Thus, there is no partial pressure drop as the reactant courses through reactor 200. Accordingly, no temperature drops are experienced within reactor 200 and gas consumption/flow requirements for uniform deposition can be made substantially lower.

While the principles of the invention have been described in connection with specific apparatus, it is to be understood that this description is not a limitation on the scope of the invention.

What is claimed is:

1. A process for recycling a vapor-phase chemical comprising:

introducing vapor-phase chemicals taken from the group consisting of $NH_3$, $N_2O$, $SiF_4$, $SiH_4$, $TiCl_4$, $N_2$, Ar, HCl, and $SiCl_4$ and including pure $H_2$ gas into a reactor with sufficient supplied energy to cause a first reaction in said reactor;

exhausting gases from said reactor resulting from said first reaction;

separating a non-purified hydrogen gas from said exhausted gases;

venting said exhausted gases free of said non-purified hydrogen;

purifying said non-purified hydrogen gas to generate a purified $H_2$ gas; and thereafter introducing said purified $H_2$ gas into said reactor along with additional vapor-phase chemicals including pure $H_2$ gas into said reactor with sufficient supplied energy to cause a second reaction in said reactor.

2. A process for recycling a vapor-phase chemical comprising:

introducing vapor-phase chemicals including a first gas into a reactor with sufficient supplied energy to cause a first reaction in said reactor;

exhausting gases from said reactor resulting from said reaction;

separating a second gas from said exhausted gases;

purifying said second gas to generate a third gas; and thereafter introducing said third gas into said reactor along with said vapor-phase chemicals including said first gas into said reactor with sufficient supplied energy to cause a second reaction in said reactor, said first and second reactions including depositing a thin film layer on a substrate positioned in said reactor.

3. The process of claim 2, wherein said first gas comprises pure $H_2$.

4. The process of claim 2, wherein said second gas comprises non-purified $H_2$.

5. The process of claim 2, wherein said third gas comprises between about 80% to 90% of the quantity of said pure $H_2$ introduced in said reactor.

6. The process of claim 2, wherein the sufficient supplied energy comprises an RF low frequency power energy level of between about 0.318 watt/cm$^2$ to about 3.18 watts/cm$^2$.

7. The process of claim 2, wherein said reactor comprises a tapered outer shell surrounding a tapered susceptor.

8. The process of claim 2, wherein said third gas comprises purified $H_2$.

9. The process of claim 2, wherein said vapor-phase chemicals comprise gases selected from the group consisting of $NH_3$, $N_2O$, $SiF_4$, $SiH_4$, $TiCl_4$, $N_2$, Ar, HCl, and $SiCl_4$.

10. A process for recycling a by-product of a chemical reaction comprising:

introducing vapor-phase chemicals including first use hydrogen into a reactor with sufficient supplied energy to cause a first reaction for depositing a thin film layer on a substrate positioned in said reactor;

moving said second use hydrogen through a filter to convert said second use hydrogen to processing quality hydrogen; and thereafter introducing said processing quality hydrogen into said reactor with said vapor-phase chemicals to be used in a second reaction for depositing a thin film layer on a substrate positioned in said reactor.

11. The process of claim 10, wherein said processing quality hydrogen comprises between about 80% to 90% of the quantity of said first use hydrogen introduced in said reactor.

12. The process of claim 10, wherein the sufficient supplied energy comprises an RF low frequency power energy level of between about 0.318 watt/cm$^2$ to about 3.18 watts/cm$^2$.

13. The process of claim 10, wherein said reactor comprises a tapered outer shell surrounding a tapered susceptor.

14. The process of claim 10, wherein said vapor-phase chemicals comprise gases selected from the group consisting of $NH_3$, $N_2O$, $SiF_4$, $SiH_4$, $TiCl_4$, $N_2$, Ar, HCl, and $SiCl_4$.

* * * * *